(12) United States Patent
Hadjichristos et al.

(10) Patent No.: US 9,166,534 B2
(45) Date of Patent: Oct. 20, 2015

(54) TUNABLE LOADLINE

(71) Applicant: QUALCOMM Incorporated, San Diego, CA (US)

(72) Inventors: Aristotele Hadjichristos, San Diego, CA (US); Calogero Davide Presti, San Diego, CA (US); Babak Nejati, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/109,239

(22) Filed: Dec. 17, 2013

(65) Prior Publication Data

US 2015/0171800 A1 Jun. 18, 2015

(51) Int. Cl.
| | |
|---|---|
| H03F 3/191 | (2006.01) |
| H03F 1/56 | (2006.01) |
| H03F 3/19 | (2006.01) |
| H03F 3/195 | (2006.01) |
| H03F 3/24 | (2006.01) |

(52) U.S. Cl.
CPC .................. *H03F 1/565* (2013.01); *H03F 3/19* (2013.01); *H03F 3/195* (2013.01); *H03F 3/245* (2013.01); *H03F 3/191* (2013.01); *H03F 2200/111* (2013.01); *H03F 2200/378* (2013.01); *H03F 2200/387* (2013.01); *H03F 2200/391* (2013.01); *H03F 2200/417* (2013.01); *H03F 2200/423* (2013.01)

(58) Field of Classification Search
CPC .................. H01L 2924/00; H01L 2924/00014; H01L 2224/48247; H01L 2224/49111; H04B 10/25751; H04B 1/16; H04B 1/28; H03F 2200/451; H03F 3/68; H03F 3/19; H03F 3/193; H03F 3/211; H03F 3/245; H03F 3/72

USPC .......................................... 330/301, 302, 305
See application file for complete search history.

(56) References Cited

U.S. PATENT DOCUMENTS

| | | | |
|---|---|---|---|
| 3,675,145 A | 7/1972 | Henry | |
| 5,276,912 A | 1/1994 | Siwiak et al. | |

(Continued)

FOREIGN PATENT DOCUMENTS

| | | |
|---|---|---|
| EP | 1914886 A1 | 4/2008 |
| EP | 2421151 A2 | 2/2012 |

OTHER PUBLICATIONS

International Search Report and Written Opinion—PCT/US2014/069877—ISA/EPO—Apr. 1, 2015.

*Primary Examiner* — Khanh V Nguyen
(74) *Attorney, Agent, or Firm* — Smith Risley Tempel Santos LLC

(57) ABSTRACT

A tunable loadline is disclosed. In an exemplary embodiment, an apparatus includes an amplifier configured to output an amplified signal having a selected power level and a first impedance network coupled to receive the amplified signal at an input terminal and generate a first output signal having a first power level at a first output terminal. The first impedance network being configured to load the amplified signal to convert the selected power level to the first power level. The apparatus also includes a second impedance network configured to selectively receive the first output signal and generate a second output signal having a second power level at a second output terminal. The second impedance network being configured to combine with the first impedance network to load the amplified signal to convert the selected power level to the second power level.

13 Claims, 4 Drawing Sheets

(56) References Cited

U.S. PATENT DOCUMENTS

| | | | |
|---|---|---|---|
| 5,969,582 A | 10/1999 | Boesch et al. | |
| 6,078,794 A | 6/2000 | Peckham et al. | |
| 6,317,608 B1 * | 11/2001 | Glocker | 455/553.1 |
| 7,362,171 B2 * | 4/2008 | Kunihiro | 330/302 |
| 7,440,729 B2 * | 10/2008 | Solski et al. | 455/46 |
| 7,656,228 B2 * | 2/2010 | Fukuda et al. | 330/126 |
| 8,107,902 B2 | 1/2012 | Elia | |
| 8,436,694 B2 | 5/2013 | Van Bezooijen | |
| 8,718,581 B2 | 5/2014 | Elia | |
| 8,750,810 B2 * | 6/2014 | Pletcher et al. | 330/51 |
| 2001/0011926 A1 | 8/2001 | Adar | |
| 2008/0290947 A1 | 11/2008 | Dawe | |
| 2010/0308933 A1 | 12/2010 | See et al. | |

* cited by examiner

TUNABLE LOADLINE

BACKGROUND

1. Field

The present application relates generally to the operation and design of transmitters, and more particularly, to the operation and design of area efficient transmitters.

2. Background

Wireless devices are becoming increasing more complicated and now routinely provide multi-mode and multi-band operation. To support such operation, a typical wireless device may include multiple power amplifiers to amplify signals for each mode/band. For example, a multi-mode multi-band wireless device may be configured for wireless communications using multiple communication technologies, such as Global System for Mobile Communications (GSM), Wideband Code Division Multiple Access (WCDMA), Classroom 2000 (C2K), and Long Term Evolution (LTE). In a typical implementation, a wireless device may include one amplifier for low band (LB) GSM, one amplifier for LB WCDMA/LTE/C2K, one amplifier for medium band (MB) GSM, and one amplifier for MB WCDMA/LTE/C2K. Unfortunately, this four power amplifier configuration utilizes significant circuit area.

Therefore, it would be desirable to have a way to amplify signals in a multi-mode multi-band transmitter that utilizes less circuit area than conventional configurations comprising multiple amplifiers.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
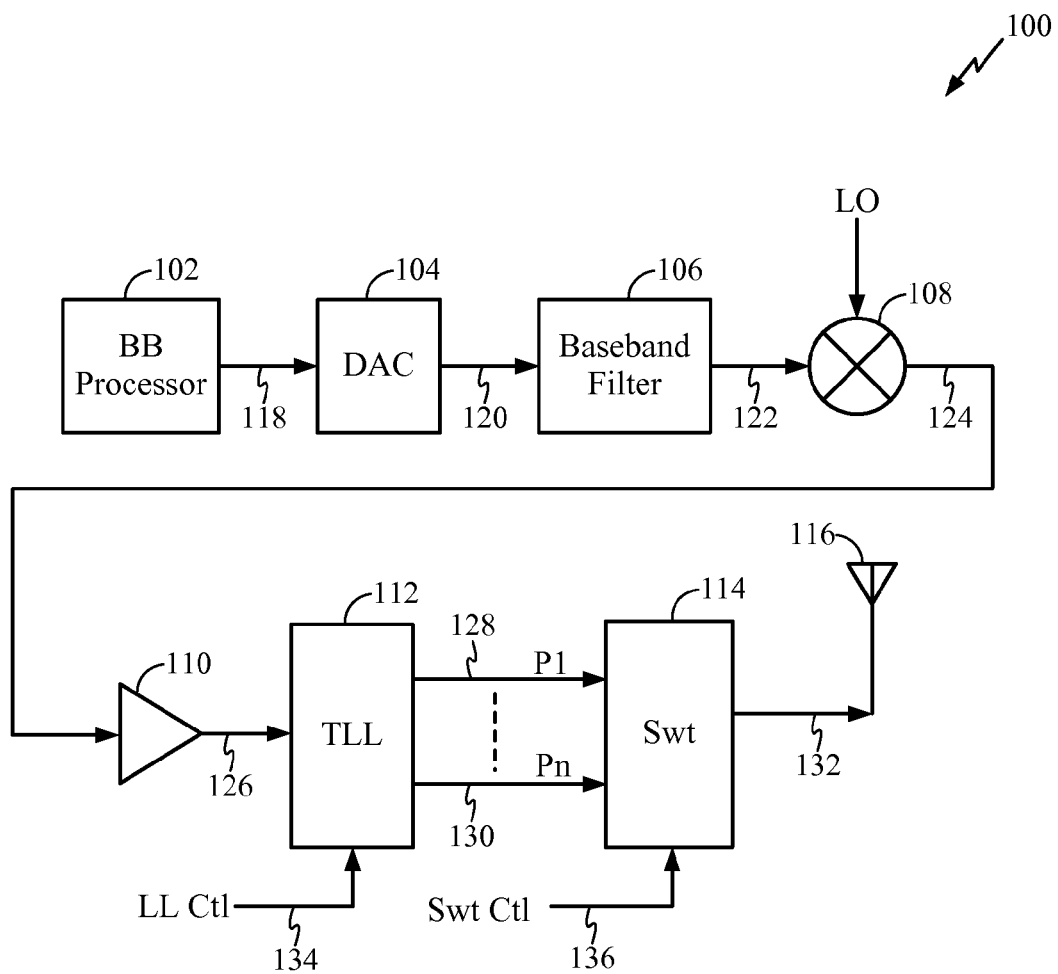
FIG. 1 shows a transmitter comprising a power amplifier configuration that includes an exemplary embodiment of novel tunable loadline for use in a wireless device.

FIG. 1 shows an exemplary embodiment of a transmitter 100 comprising a power amplifier configuration that includes a novel tunable loadline 112 for use in a wireless device. The transmitter 100 comprises a baseband (BB) processor 102, a digital-to-analog converter (DAC) 104, a baseband filter 106, a mixer (or up-converter) 108, a power amplifier (PA) 110, the novel tunable loadline 112, antenna switch 114, and an antenna 116.

During operation, the BB processor 102 outputs digital signals 118 for transmission. The digital signals 118 are input to the DAC 104 and converted to an analog baseband signal 120. The analog signal 120 is input to the baseband filter 106 to generate a filtered signal 122 that is input to the mixer 108. The mixer 108 operates to up-covert the filtered baseband signal 122 to a radio frequency (RF) signal 124 based on a local oscillator (LO) signal. The RF signal 124 is input to the PA 110 to generate an amplified RF signal 126 that is input to the novel tunable loadline 112. The tunable loadline 112 has at least two outputs (P1-Pn) that are coupled to the antenna 116 by the antenna switch 114. A loadline (LL) control signal 134 controls the operation of the tunable loadline 112 and a switch (Swt) control signal 136 controls the operation of the antenna switch 114.

In various exemplary embodiments, the novel tunable loadline 112 operates to change the loading at the output of the amplifier 110 so as to change the power level of the signals that are output from the loadline 112 and input to the switch 114. For example, the loadline 112 can be configured to set the signal line 128 to have a power level of P1 and to set the signal line 130 to have a power level of Pn. In an exemplary embodiment, P1 is greater than Pn such that P1 is a power level suitable for transmitting signals on a GSM communication network and Pn is a power level suitable for transmitting signals on a WCDMA communication network. Thus, the tunable loadline 112 makes it possible to output signals at different power levels utilizing the single amplifier 110. This allows the transmitter 100 to operate in multi mode/bands while utilizing less circuit area than conventional transmitters having multiple amplifiers. A more detailed description of various exemplary embodiments of the novel tunable loadline 112 is provided below.

Figure 2:
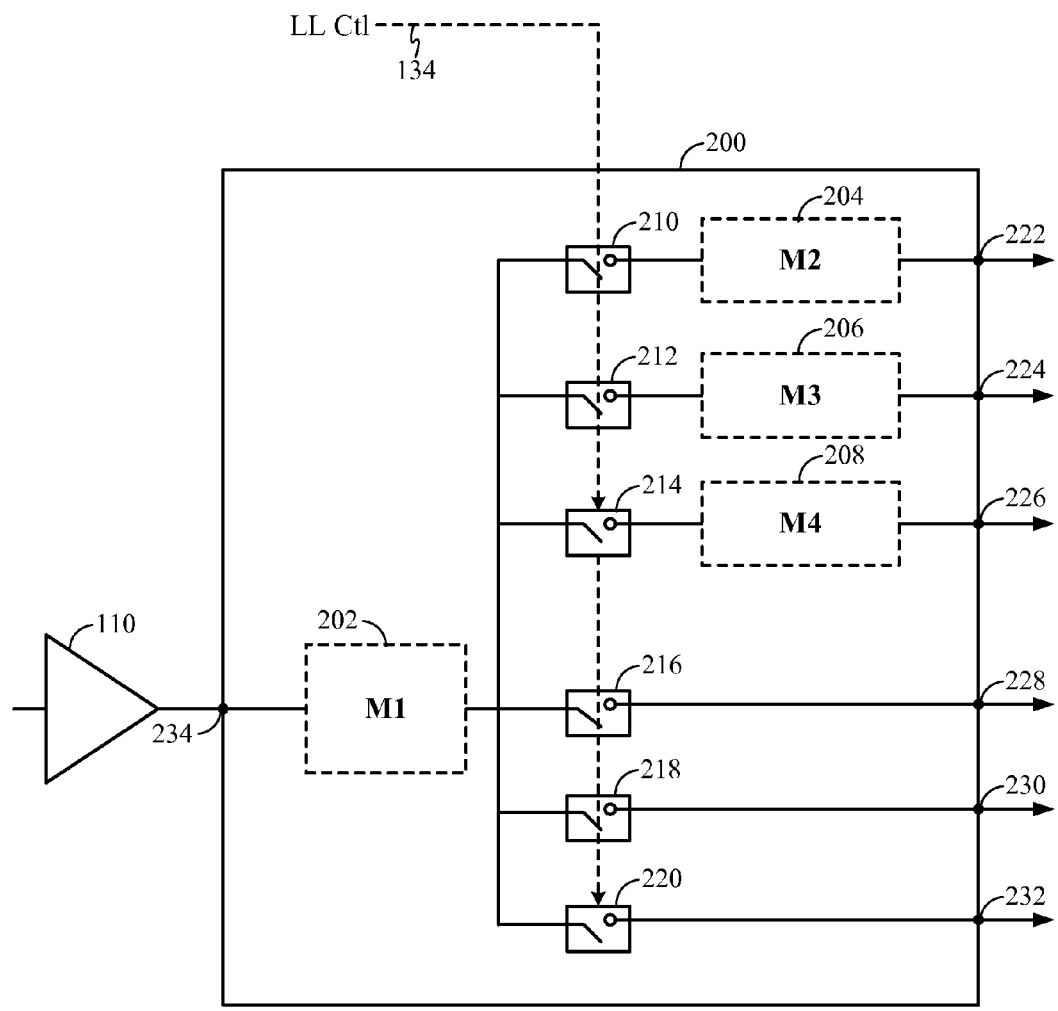
FIG. 2 shows an exemplary embodiment of a novel tunable loadline configured for use in a wireless device.

FIG. 2 shows an exemplary embodiment of a novel tunable loadline 200 configured for use in a wireless device. The tunable loadline 200 comprises first 202, second 204, third 206, and fourth 208 matching circuits. The first matching circuit 202 is configured to receive an amplified signal from the amplifier 110 at terminal 234. The amplified signal at terminal 234 has a selected power level output from the amplifier 110. The output of the matching circuit 202 is input to a series of switches 210-220. The switches 210-220 operate to switch the output of the matching circuit 202 to other circuits based on the loadline control signal 134. For example, each of the switches 210-220 can be individually controlled by the LL control signal 134 to operate in an open or closed position. When in the closed position, a switch directs the output of the first matching circuit 202 through the switch to other circuit elements. When in the open position, the output of the first matching circuit is not propagated beyond the open switch.

During operation, the switches 216-220 operate to direct the output of the first matching circuit 202 to corresponding output terminals 228-232 based on the LL control signals 134. For example, the switch 216 directs the output of the first matching circuit 202 to the output terminal 228. This output has a first power level determined by the selected output power of the amplifier 110 and the first matching circuit 202. For example, this output terminal may be used to output signals at a first power level in a first frequency band. Similarly, the switches 218 and 220 are utilized to output signals at power levels in other frequency bands.

The switches 210-214 operate to direct the output of the first matching circuit 202 to corresponding matching circuits 204-208 based on the LL control signals 134. For example, the switch 210 directs the output of the first matching circuit 202 to the second matching circuit 204. The second matching circuit 204 combines with the first matching circuit 202 to provide an impedance combination that appears at the output of the amplifier 110 at terminal 234. The output of the second matching circuit 204 is provided at an output terminal 222 and has a power level determined by the selected output power of the amplifier 110 and the combination of the first 202 and second 204 matching circuits. For example, this output terminal may be used to output signals at a second power level in a first frequency band. Similarly, the switches 212 and 214 are utilized to output signals at other power levels in other frequency bands through the combination of their respective matching circuits (i.e., 206, 208) with the first matching circuit 202. Accordingly, the tunable loadline 200 can be tuned to output signals in selected frequency bands having selected power levels based on the control of the switches 210-220 in response to the LL control signal 134.

Figure 3:
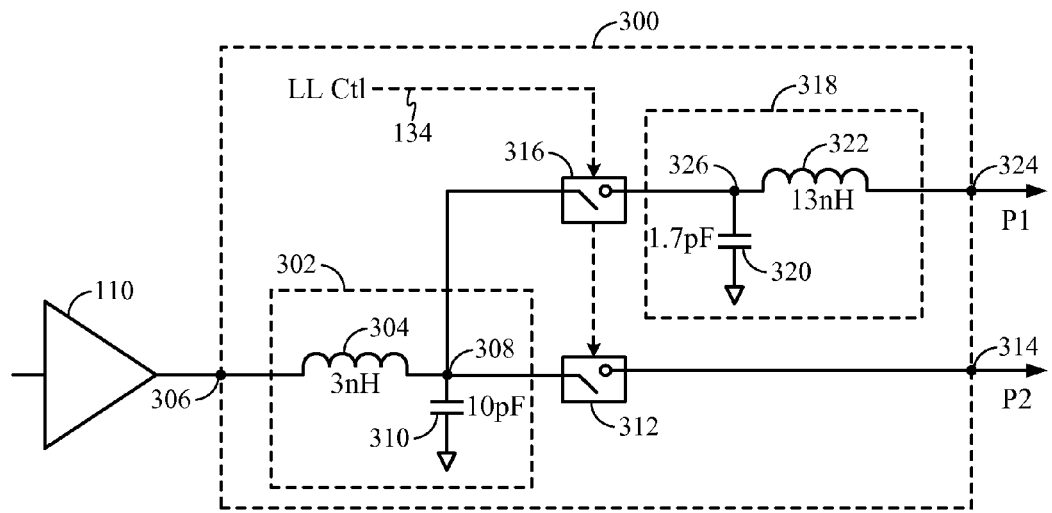
FIG. 3 shows an exemplary detailed embodiment of a novel tunable loadline configured for use in a wireless device.

FIG. 3 shows an exemplary detailed embodiment of a novel tunable loadline 300 configured for use in a wireless device. For example, the loadline 300 is suitable for use as the tunable loadline 112 shown in FIG. 1. The tunable loadline 300 is configured from the tunable loadline 200 and comprises two matching networks 302 and 318.

The tunable loadline 300 is configured to adjust to the various operating modes of the wireless device to provide signal amplification compatible with operation at multiple power levels (for example, for use in GSM or WCDMA communication networks). As a result, a single amplifier can be utilized instead of using multiple amplifiers as in conventional multi-mode/band transmitters.

To transmit a signal in a WCDMA communication network, the tunable loadline 300 comprises a first impedance network 302 comprising a first inductor 304 connected between an input terminal 306 and a first output terminal 308. The first impedance network 302 also comprises a first capacitor 310 connected between the first output terminal 308 and a signal ground. The first impedance network 302 is configured to receive an amplified WCDMA signal from the amplifier 110 at the input terminal 306 and pass this signal to a first switch 312 that directs the signal to an antenna through node 314 for transmission. In an exemplary embodiment, the first inductor 304 has a value of (3 nH) and the first capacitor 310 has a value of (10 pF) to provide a load to the amplifier 110 (to load the amplified signal at the input terminal 306) of approximately 5 ohms. This configuration results in a transmit signal at terminal 314 having a transmit power of P2 suitable for transmission in a WCDMA network.

To transmit a signal in a GSM communication network, the first switch 312 is opened and a second switch 316 is closed to direct the signal at the first output terminal 308 to a terminal 326 at a second impedance network 318. The second impedance network 318 comprises a second capacitor 320 connected between the terminal 326 and the signal ground. The second impedance network 318 also comprises a second inductor 322 connected between the terminal 326 and a second output terminal 324. In an exemplary embodiment, the second inductor 322 has a value of (13 nH) and the second capacitor 320 has a value of (1.7 pF) that combine with the first inductor 304 and first capacitor 310 to adjust the overall load to the amplifier 110 to approximately 2 ohms. For example, the second impedance network 318 is configured to combine with the first impedance network 302 to load the amplified signal at the input terminal 306 to convert the selected power level to the power level P1. This configuration results in a transmit signal at terminal 324 having a transmit power of P1 suitable for transmission in a GSM network.

Since the specified GSM power is higher than the WCDMA power, the tunable loadline 300 operates to increase or decrease the load according to the selected transmission technology to allow a single amplifier (i.e., amplifier 110) to be used to transmit signals within the specified power level for the transmission technology selected. In an exemplary embodiment, a controller or other entity at the wireless device outputs the LL control signal 134 to control the operation of the switches 312 and 316 to select the appropriate load for the amplifier based on the selected transmission technology. For example, to transmit signals at the appropriate power levels for WCDMA, the LL control line 134 closes the switch 312 and opens the switch 316. This results in transmit signals having power levels suitable for WCDMA being output from the terminal 314. Likewise, to transmit signals at the appropriate power levels for GSM, the LL control line 134 closes the switch 316 and opens the switch 312. This results in transmit signals having power levels suitable for GSM being output from the terminal 324.

Figure 4:
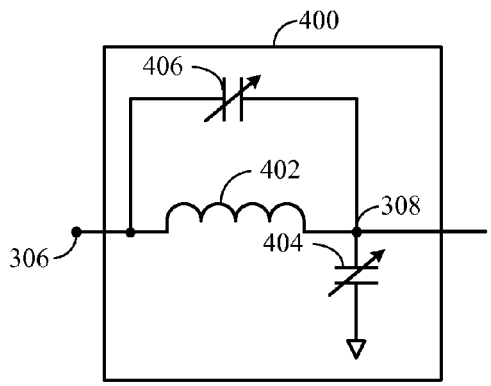
FIG. 4 shows an exemplary embodiment of a matching circuit configured for use in the tunable loadline shown in FIG. 3.

FIG. 4 shows an exemplary embodiment of a matching circuit 400 configured for use in the tunable loadline of FIG. 3. For example, the matching circuit 400 is suitable for use as the matching circuit 302 shown in FIG. 3. The matching circuit 400 comprises an inductor 402 connected between the terminals 306 and 308. A first variable capacitor 404 is connected between the terminal 308 and a signal ground. The first variable capacitor 404 is adjustable to allow the matching circuit 400 to be tuned to obtain desired operation at selected frequencies. The matching circuit 400 also comprises an optional variable capacitor 406 connected between the terminal 306 and the terminal 308. The optional variable capacitor 406 is also tunable to obtain desired operation at selected frequencies.

Figure 5:
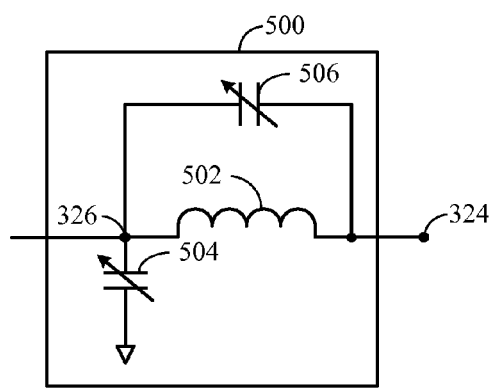
FIG. 5 shows an exemplary embodiment of a matching circuit configured for use in the tunable loadline shown in FIG. 3.

FIG. 5 shows an exemplary embodiment of a matching circuit 500 configured for use in the tunable loadline of FIG. 3. For example, the matching circuit 500 is suitable for use as the matching circuit 318 shown in FIG. 3. The matching circuit 500 comprises an inductor 502 connected between the terminals 326 and 324. A first variable capacitor 504 is connected between the terminal 326 and a signal ground. The first variable capacitor 504 is adjustable to allow the matching circuit 500 to be tuned to obtain desired operation at selected frequencies. The matching circuit 500 also comprises an optional variable capacitor 506 connected between the terminal 326 and the terminal 324. The optional variable capacitor 506 is also tunable to obtain desired operation at selected frequencies.

Figure 6:
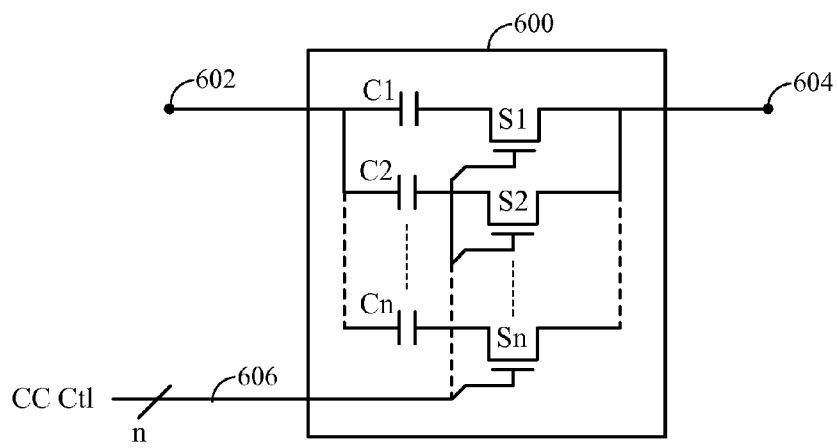
FIG. 6 shows an exemplary embodiment of a variable capacitor configured for use in the matching circuits shown in FIGS. 4-5.

FIG. 6 shows an exemplary embodiment of a variable capacitor 600 configured for use in the matching circuits 400 and 500 shown in FIG. 4 and FIG. 5. The variable capacitor 600 comprises capacitors C1 through Cn that are connected to a first terminal 602. The capacitors C1-Cn are further connected to transistor switches S1-Sn, respectively. The outputs of the transistor switches S1-Sn are connected to a second terminal 604. The transistor switches S1-Sn are controlled by capacitor control (CC) signals 606 that are connected to the gate terminals of the transistor switches. The CC signals 606 are generated by a processor, controller, or other entity to control which of the switches S1-Sn are open and which are closed. In an exemplary embodiment, the capacitors C1-Cn have the same capacitance value. In other exemplary embodiments, each of the capacitors C1-Cn has a capacitance value that is set to any desired value.

During operation, the CC control lines 606 are set by a processor, controller, or other entity to open and close selected switches of the transistors switches S1-Sn. When a switch is closed, it connects its associated capacitor to the second terminal 604. For example, if the switch S2 is closed by its associated CC control line, the capacitor C2 is connected between the first terminal 602 and the second terminal 604. The capacitors that are associated with closed switches combine to form a total capacitance between the first terminal 602 and the second terminal 604. For example, the capacitors associated with closed switches combine in a parallel combination to determine the total capacitance. Thus, it is possible to vary the capacitance provided by the variable capacitor 600 by opening and closing the appropriate switches. By varying or setting the capacitance value of the variable capacitor 600, it is possible to tune the operation of the matching circuits 400 and 500 shown in FIG. 4 and FIG. 5.

Figure 7:
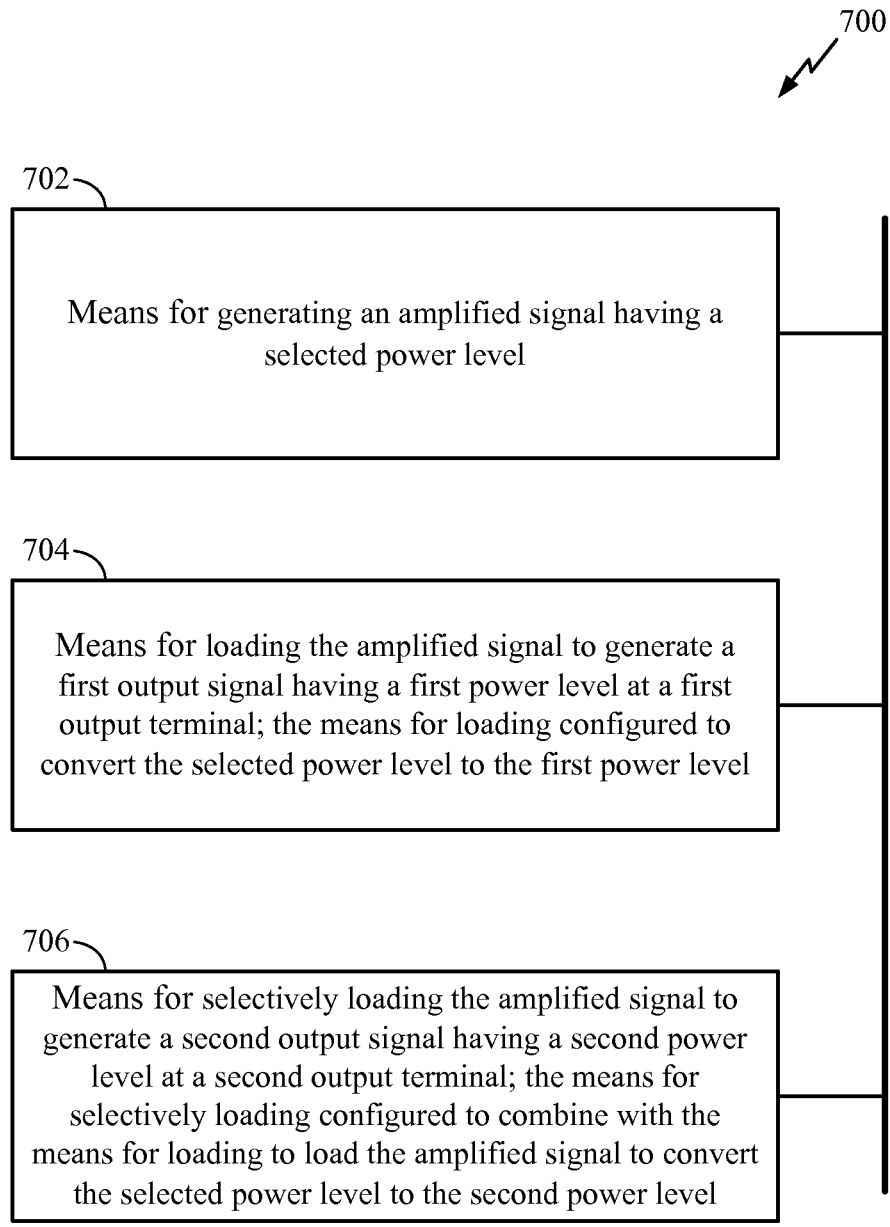
FIG. 7 shows an exemplary embodiment of a tunable loadline apparatus configured for improved efficiency and reduced circuit area.

FIG. 7 shows an exemplary embodiment of a tunable loadline apparatus 700 configured for improved efficiency and reduced circuit area. For example, the apparatus 700 is suitable for use as the tunable loadline 200 shown in FIG. 2 or the tunable loadline 300 shown in FIG. 3. In an aspect, the apparatus 700 is implemented by one or more modules configured to provide the functions as described herein. For example, in an aspect, each module comprises hardware and/or hardware executing software.

The apparatus 700 comprises a first module comprising means (702) for generating an amplified signal having a selected power level, which in an aspect comprises the amplifier 110.

The apparatus 700 comprises a second module comprising means (704) for loading the amplified signal to generate a first output signal having a first power level at a first output terminal; the means for loading configured to convert the selected power level to the first power level, which in an aspect comprises the first impedance network 202.

The apparatus 700 comprises a third module comprising means (706) for selectively loading the amplified signal to generate a second output signal having a second power level at a second output terminal; the means for selectively loading configured to combine with the means for loading to load the amplified signal to convert the selected power level to the second power level, which in an aspect comprises the second impedance network 204.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    an amplifier configured to output an amplified signal having a selected power level;
    a first impedance network coupled to receive the amplified signal at a first impedance network input terminal and generate a first output signal having a first power level at a first impedance network output terminal, the first impedance network configured to load the amplified signal to convert the selected power level to the first power level;
    a first switch having a first switch input terminal and a first switch output terminal, the first switch input terminal coupled to the first impedance network output terminal, the first switch configured to selectively provide the first output signal at the first switch output terminal;
    a second switch having a second switch input terminal and a second switch output terminal, the second switch input terminal coupled to the first impedance network output terminal, the second switch configured to selectively provide the first output signal at the second switch output terminal;
    a second impedance network having a second impedance network input terminal and a second impedance network output terminal, the second impedance network input terminal coupled to the first switch output terminal, the second impedance network configured to selectively receive the first output signal and generate a second output signal having a second power level at the second impedance network output terminal, the second impedance network configured to combine with the first impedance network to load the amplified signal to convert the selected power level to the second power level; and
    an antenna switch circuit having a first antenna switch input terminal coupled to the second impedance network output terminal and configured to receive the second output signal, a second antenna switch input terminal coupled to the second switch output terminal and configured to receive the first output signal, and an antenna switch output terminal coupleable to an antenna.

2. The apparatus of claim 1, the apparatus configured for use in a device to generate the first and second power levels from the selected power level.

3. The apparatus of claim 1, the first impedance network comprising:
    a first inductor connected between the input terminal and the first output terminal; and
    a first capacitor connected between the first output terminal and a signal ground.

4. The apparatus of claim 1, the second impedance network comprising:
    a second capacitor connected between the first output terminal and the signal ground; and
    a second inductor connected between the first output terminal and the second output terminal.

5. The apparatus of claim 1, the second power level is higher than the first power level.

6. The apparatus of claim 5, the first power level is configured for operation on a WCDMA network and the second power level is configured for operation on a GSM network.

7. An apparatus comprising:
    means for generating an amplified signal having a selected power level;
    means for loading the amplified signal to generate a first output signal having a first power level at a first output terminal, the means for loading configured to convert the selected power level to the first power level;
    means for selectively loading the amplified signal to generate a second output signal having a second power level at a second output terminal, the means for selectively loading configured to combine with the means for loading to load the amplified signal to convert the selected power level to the second power level; and
    means for selectively coupling the first output signal and selectively coupling the second output signal to an antenna.

8. The apparatus of claim 7, the apparatus configured for use in a device to generate the first and second power levels from the selected power level.

9. The apparatus of claim 7, the means for loading comprising means for receiving the amplified signal at an input terminal.

10. The apparatus of claim 9, the means for loading comprising:
    a first inductor connected between the input terminal and the first output terminal; and
    a first capacitor connected between the first output terminal and a signal ground.

11. The apparatus of claim 10, the means for selectively loading comprising:
    a second capacitor connected between the first output terminal and the signal ground; and
    a second inductor connected between the first output terminal and the second output terminal.

12. The apparatus of claim 7, the second power level is higher than the first power level.

13. The apparatus of claim 12, the first power level is configured for operation on a WCDMA network and the second power level is configured for operation on a GSM network.

* * * * *